United States Patent
Yang et al.

(10) Patent No.: US 12,086,024 B2
(45) Date of Patent: Sep. 10, 2024

(54) METHOD AND APPARATUS FOR REPAIRING FAIL LOCATION

(71) Applicant: CHANGXIN MEMORY TECHNOLOGIES, INC., Hefei (CN)

(72) Inventors: Lei Yang, Hefei (CN); Yui-Lang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 327 days.

(21) Appl. No.: 17/666,552

(22) Filed: Feb. 8, 2022

(65) Prior Publication Data

US 2022/0334913 A1 Oct. 20, 2022

Related U.S. Application Data

(63) Continuation of application No. PCT/CN2021/112689, filed on Aug. 16, 2021.

(30) Foreign Application Priority Data

Apr. 15, 2021 (CN) .......................... 202110407955.9

(51) Int. Cl.
   *G06F 11/00* (2006.01)
   *G06F 11/07* (2006.01)
(52) U.S. Cl.
   CPC ...... *G06F 11/0793* (2013.01); *G06F 11/0751* (2013.01)
(58) Field of Classification Search
   CPC .......................... G06F 11/0793; G06F 11/0751

USPC .......................................................... 714/1–57
See application file for complete search history.

(56) References Cited

U.S. PATENT DOCUMENTS

| | | | |
|---|---|---|---|
| 2004/0088612 A1* | 5/2004 | Seong | G11C 29/838 714/710 |
| 2004/0255198 A1* | 12/2004 | Matsushita | H01L 22/20 714/37 |
| 2006/0053357 A1 | 3/2006 | Rajski et al. | |
| 2007/0247937 A1* | 10/2007 | Moriyama | G11C 29/56008 365/200 |
| 2008/0144410 A1* | 6/2008 | Koshikawa | G11C 29/835 365/225.7 |
| 2013/0016895 A1 | 1/2013 | Song et al. | |
| 2013/0163851 A1 | 6/2013 | Dalla-Torre et al. | |

FOREIGN PATENT DOCUMENTS

| | | |
|---|---|---|
| CN | 102157203 A | 8/2011 |
| CN | 104866731 A | 8/2015 |
| CN | 110968985 A | 4/2020 |
| CN | 111178374 A | 5/2020 |
| CN | 111198924 A | 5/2020 |

\* cited by examiner

*Primary Examiner* — Sarai E Butler
(74) *Attorney, Agent, or Firm* — Kilpatrick Townsend & Stockton LLP

(57) ABSTRACT

Embodiments provide a method and an apparatus for repairing a fail location. When repairing a fail location of a wafer, a fail bit in a wafer to be processed may be first determined, and a target potential fail bit associated with the fail bit may be determined based on a potential mining rule included in a mining rule library.

18 Claims, 6 Drawing Sheets

METHOD AND APPARATUS FOR REPAIRING FAIL LOCATION

CROSS-REFERENCE TO RELATED APPLICATION

This application is a continuation of PCT/CN2021/112689, filed on Aug. 16, 2021, which claims priority to Chinese Patent Application No. 202110407955.9 titled "METHOD AND APPARATUS FOR REPAIRING FAIL LOCATION" and filed on Apr. 15, 2021, the entire contents of which are incorporated herein by reference.

TECHNICAL FIELD

The present disclosure relates to, but is not limited to, a method and an apparatus for repairing a fail location.

BACKGROUND

In a circuit probe test (CP test) phase, generally a corresponding back-up circuit is respectively allocated to a fail bit (FB) location and a predicted fail bit location in a wafer. Next, in a fusing phase, the fail bit location and the predicted fail bit location are repaired according to the corresponding back-up circuit.

The fail bit location refers to a row location or a column location of a current fail bit that has been determined to have a fault, and the predicted fail bit location refers to a row location or a column location of a bit which is predicted to likely have a fault in subsequent test phases by relying on artificial experiences based on the current fail bit that has been determined to have a fault.

However, determining the predicted fail bit location by relying on artificial experiences may have a problem of omission of some of the fail bit locations, such that these fail bit locations cannot be repaired in time, resulting in a higher probability of failure of the wafer.

SUMMARY

Embodiments of the present disclosure provide a method and an apparatus for repairing a fail location. When a fail location is repaired, omission of repairing a fail bit location may be avoided to a certain extent, such that probability of failure of a wafer can be effectively reduced.

In a first aspect, the embodiments of the present disclosure provide a method for repairing a fail location, and the method includes:

determining a fail bit in a wafer to be processed;

determining a target potential fail bit associated with the fail bit based on a mining rule in a mining rule library, wherein the mining rule library comprises a potential mining rule, the potential mining rule being obtained by means of a potential fail location determined based on a preset mining rule; and repairing a fail location corresponding to the fail bit and a target potential fail location corresponding to the target potential fail bit, to obtain a repaired target wafer.

In the second aspect, the embodiments of the present disclosure also provide an apparatus for repairing a fail location, and the apparatus includes:

a determining unit configured to determine a fail bit in a wafer to be processed;

a processing unit configured to determine a target potential fail bit associated with the fail bit based on a mining rule in a mining rule library, wherein the mining rule library comprises a potential mining rule, and the potential mining rule is obtained by means of a potential fail location determined based on a preset mining rule; and a repairing unit configured to repair a fail location corresponding to the fail bit and a target potential fail location corresponding to the target potential fail bit, to obtain a repaired target wafer.

In a third aspect, the embodiments of the present disclosure also provide a computer-readable storage medium having a computer program stored thereon. The computer program is executable by a processor, whereby the processor is configured to perform the method for repairing a fail location according to any one of the possible implementations in the first aspect.

In a fourth aspect, the embodiments of the present disclosure also provide a computer device, which includes a memory, a processor, and a computer program stored on the memory and running on the processor. The computer program is executable by the processor, whereby the processor is configured to perform the method for repairing a fail location according to any one of the possible implementations in the first aspect.

In a fifth aspect, the embodiments of the present disclosure also provide a computer program product, which includes a computer program. The computer program is stored in a readable storage medium, and at least one processor of an electronic device can read the computer program from the readable storage medium. The at least one processor executes the computer program, such that the electronic device is caused to perform the method for repairing a fail location according to any one of the possible implementations in the first aspect.

Figure 1:
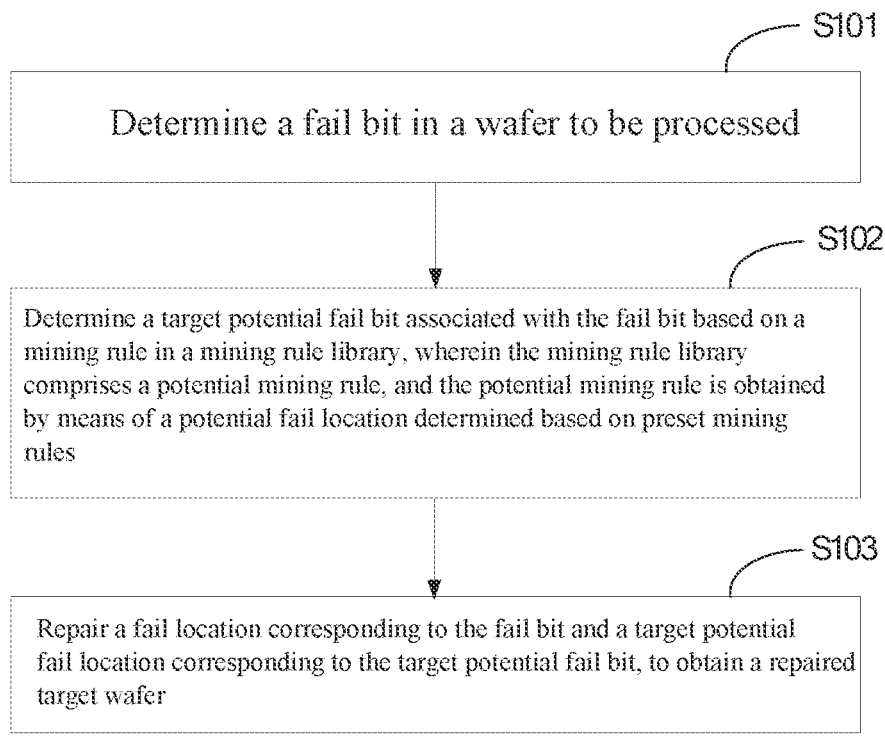
FIG. 1 is a schematic flowchart of a method for repairing a fail location according to an embodiment of the present disclosure.

Some embodiments of the present disclosure have been shown by the above drawings, and more detailed description will be made hereinafter. These drawings and text description are not intended for limiting the scope of conceiving the present disclosure in any way, but for illustrating the concept of the present disclosure for those skilled in the art by referring to some embodiments.

DETAILED DESCRIPTION

Reference will now be made in detail to exemplary embodiments, examples of which are illustrated in the accompanying drawings. When accompanying figures are mentioned in the following descriptions, the same numbers in different drawings represent the same or similar elements, unless otherwise represented. The implementations set forth in the following exemplary embodiments do not represent all implementations consistent with the present disclosure. Instead, they are merely examples of apparatuses and methods consistent with aspects related to the present disclosure as recited in the appended claims.

In the embodiments of the present disclosure, "at least one" refers to one or more, and "a plurality of" refers to two or more. The expression "and/or" used for describing an association relationship between association objects represents presence of three relationships. For example, A and/or B may represent presence of the A only, presence of both the A and the B, and presence of the B only, wherein the A and the B may be singular or plural. In the text description of the present disclosure, character "/" generally indicates that an "or" relationship is between the association objects.

Technical solutions provided by the embodiments of the present disclosure may be applied to wafer inspection scenarios. A wafer includes a lot of arrays, each of the lot of arrays includes a plurality of units, and each of the plurality of units may be denote as one bit. That is, each wafer includes tens of thousands of bits. The tens of thousands of bits may include a plurality of fail bits. Therefore, in a circuit probe test (CP Test) phase, generally a fail bit (FB) location and a predicted fail bit location in the wafer are determined, and a corresponding back-up circuit is respectively allocated to the fail bit (FB) location and the predicted fail bit location in the wafer. Next, in a fusing phase, the fail bit location and the predicted fail bit location are repaired according to the corresponding back-up circuit. However, determining the predicted fail bit location by relying on artificial experiences may have a problem of omission of some of the fail bit locations, such that these fail bit locations cannot be repaired in time, resulting in a higher probability of failure of the wafer.

To mine out more fail bit locations in the CP Test phase, and to repair these fail bit location in time, it may be considered that more potential fail bits associated with fail bits are mined out in combination with more mining rules, rather than relying on the artificial experiences to determine the predicted fail bit locations, such that more potential fail bits associated with the fail bits can be mined out. In this way, when the fail locations are repaired, omission of repairing some fail bit locations may be avoided to a certain extent, such that probability of failure of the wafer can be effectively reduced.

Based on the above technical concept, the embodiments of the present disclosure provide a method for repairing a fail location. When repairing a fail location of the wafer, a fail bit in a wafer to be processed may be determined first, and a target potential fail bit associated with the fail bit may be determined based on a mining rule in a mining rule library, wherein the mining rule library comprises a potential mining rule, and the potential mining rule is obtained by means of a potential fail location determined based on a preset mining rule. Next, after a target potential fail bit associated with the fail bit is determined, a fail location corresponding to the fail bit and a target potential fail location corresponding to the target potential fail bit are repaired, to obtain a repaired target wafer.

For example, the mining rule in the mining rule library not only includes the potential mining rule obtained based on the potential fail location determined based on the preset mining rule, but also may include preset mining rules, which may be set according to actual needs. The preset mining rules may be understood as existing mining rules obtained by relying on the artificial experiences in the existing technologies. Generally, the preset mining rules are some explicit mining rules that are easier to find.

It is to be understood that in the embodiments of the present disclosure, the mining rule is configured for describing an association relationship between a malfunctioning fail bit and a potential fail bit. Therefore, after the fail bit in the wafer to be processed is determined, a target potential fail bit associated with the fail bit may be determined based on a potential mining rule included in the mining rule library, such that more potential fail bits can be mined out. In this way, when the fail location corresponding to the fail bit and the target potential fail location corresponding to the target potential fail bit are repaired subsequently, omission of repairing the fail bit location may be avoided to a certain extent, such that probability of failure of the wafer can be effectively reduced.

As can be seen, in the embodiments of the present disclosure, when repairing a fail location of a wafer, a fail bit in the wafer to be processed may be first determined, and a target potential fail bit associated with the fail bit may be determined based on a potential mining rule included in the mining rule library. In this way, more target potential fail bits associated with the fail bit may be mined out, such that when the fail location corresponding to the fail bit and the target potential fail location corresponding to the target potential fail bit are repaired subsequently, omission of repairing the fail bit location may be avoided to a certain extent. In this way, probability of failure of the wafer can be effectively reduced.

In addition, compared with determining the potential fail bit by relying on the artificial experiences, the determine a target potential fail bit associated with the fail bit based on a potential mining rule included in the mining rule library can reduce time costs spent in artificial observation, such that efficiency of mining a potential fail bit can be increased.

Hereinafter, the method for repairing a fail location provided by the embodiments of the present disclosure will be described in detail through some embodiments. It is to be understood that the following embodiments may be combined with each other, and the same or similar concepts or processes may not be repeated in some embodiments.

FIG. 1 is a schematic flowchart of a method for repairing a fail location according to an embodiment of the present disclosure. The method for repairing a fail location may be performed by a software and/or hardware apparatus, wherein the hardware apparatus may be an apparatus for repairing a fail location. For example, referring to FIG. 1. the method for repairing a fail location may include:

S101: determining a fail bit in a wafer to be processed.

It is to be understood that the fail bit refers to a fail bit that has been determined to have a fault.

For example, when determining the fail bit in the wafer to be processed, a tester, a probe card, a probe station, and so on may be employed to test the wafer to be processed for a variety of test items. For example, voltage, current, timing and function of each chip in the wafer to be processed are tested, and those bits in each chip that do not meet test results are screened out as fail bits.

After it is determined that a malfunctioning fail bit is present in the wafer to be processed, a target potential fail bit associated with the fail bit may be determined based on a potential mining rule included in a mining rule library. That is, the following Step S102 is performed.

S102: determining a target potential fail bit associated with the fail bit based on a mining rule in a mining rule library. The mining rule library comprises a potential mining rule, wherein the potential mining rule is obtained by means of a potential fail location determined based on preset mining rules.

For example, the mining rule in the mining rule library not only includes the potential mining rule obtained based on the potential fail location determined based on the preset mining rule, but also may include preset mining rules, which may be set according to actual needs. The preset mining rules may be understood as existing mining rules obtained by relying on the artificial experiences in the existing technologies. Generally, the preset mining rules are some explicit mining rules that are easier to find.

The mining rule is configured for describing an association relationship between a malfunctioning fail bit and a potential fail bit. Therefore, after a fail bit in the wafer to be processed is determined, a target potential fail bit associated with the fail bit may be determined based on a potential mining rule included in the mining rule library, such that more potential fail bits can be mined out. In this way, when the fail location corresponding to the fail bit and the target potential fail location corresponding to the target potential fail bit are repaired subsequently, omission of repairing the fail bit location may be avoided to a certain extent, such that probability of failure of the wafer can be effectively reduced.

S103: repairing a fail location corresponding to the fail bit and a target potential fail location corresponding to the target potential fail bit, to obtain a repaired target wafer.

For example, when repairing the fail location corresponding to the fail bit and the target potential fail location corresponding to the target potential fail bit, the fail location corresponding to the fail bit and the target potential fail location corresponding to the target potential fail bit may be repaired by means of a back-up integrated circuit. In this way, repairing the fail location corresponding to the fail bit and the target potential fail location corresponding to the target potential fail bit is implemented.

As can be seen, in the embodiments of the present disclosure, when repairing a fail location of a wafer, a fail bit in the wafer to be processed may be first determined, and a target potential fail bit associated with the fail bit may be determined based on a potential mining rule included in the mining rule library. In this way, more target potential fail bits associated with the fail bit may be mined out, such that when the fail location corresponding to the fail bit and the target potential fail location corresponding to the target potential fail bit are repaired subsequently, omission of repairing the fail bit location may be avoided to a certain extent. In this way, probability of failure of the wafer can be effectively reduced.

Based on the embodiment as shown in FIG. 1, it may be understood that in the above S102, before the target potential fail bit associated with the fail bit is determined based on the potential mining rule included in the mining rule library, it is needed to construct the potential mining rule. Next, the target potential fail bit associated with the fail bit may be determined based on the potential mining rule. When constructing a potential mining rule, the potential mining rule may be constructed based on historical sample data. In the following, it will be described in detail how to construct the potential mining rule based on the historical sample data in the embodiments of the present disclosure through the embodiment as shown in FIG. 2.

Figure 2:
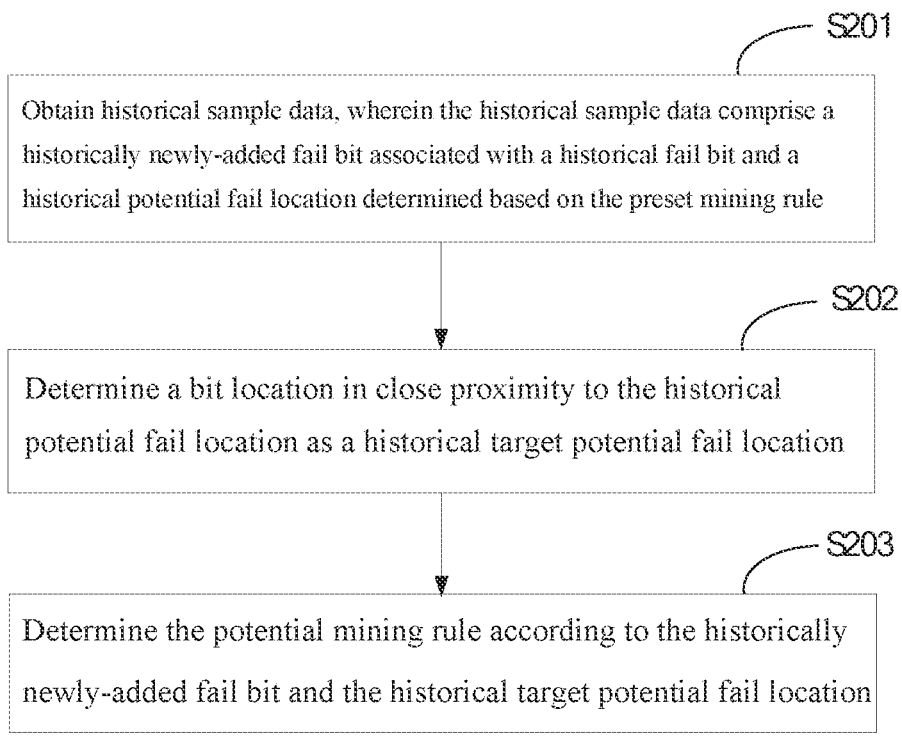
FIG. 2 is a schematic flowchart of a method for determining a potential mining rule according to an embodiment of the present disclosure.

FIG. 2 is a schematic flowchart of a method for determining a potential mining rule according to an embodiment of the present disclosure. The method for determining a potential mining rule may be executed by a software and/or hardware apparatus, wherein the hardware apparatus also may be an apparatus for repairing a fail location. For example, as shown in FIG. 2, the method for determining a potential mining rule may include:

S201: obtaining historical sample data, wherein the historical sample data comprise a historically newly-added fail bit associated with a historical fail bit and a historical potential fail location determined based on the preset mining rule.

The historical fail bit may be understood as a fail bit determined to have a fault in the historical CP Test phase. The historical potential fail location may be understood as a potential fail location obtained by predicting a preset mining rule formed by relying on artificial experience prediction based on the fail bit determined to have a fault in the historical CP Test phase. The historically newly-added fail bit may be understood as a newly-added fail bit in a subsequent test phase after the historical CP Test phase.

For example, in addition to the historically newly-added fail bit and the historical potential fail location, the historical sample data may also include a historical fail bit, which may be set according to actual needs. Here, the embodiments of the present disclosure are illustrated by taking an example where the historical sample data include the historically newly-added fail bit and the historical potential fail location. However, this does not represent that the embodiments of the present disclosure are limited thereto.

In the embodiments of the present disclosure, to prevent omission of repairing the fail bit location to a certain extent when repairing the fail location, more potential mining rules may be mined out based on the historical sample data, and more potential fail bits associated with the fail bit may be mined out based on the potential mining rules. In this way, When the fail location is repaired, omission of repairing the fail bit location may be avoided to a certain extent, such that probability of failure of a wafer can be effectively reduced.

When more potential mining rules are mined out based on the historical sample data, a bit location in close proximity to the historical potential fail location may be determined as a historical target potential fail location based on the historical potential fail location in the historical sample data. That is, the following Step S202 is performed.

S202: determining a bit location in close proximity to the historical potential fail location as a historical target potential fail location.

For example, a target type corresponding to the historical potential fail location may be determined when the bit location in close proximity to the historical potential fail location is determined as the historical target potential fail location, wherein the target type comprises a redundant word line type and a redundant bit line type. Next, the bit location in close proximity to the historical potential fail location is determined as the historical target potential fail location according to the target type.

For example, when the bit location in close proximity to the historical potential fail location is determined as the historical target potential fail location according to the target type, the bit location in close proximity to the historical potential fail location and at a distance of a first preset number of bits from the historical potential fail location may be determined as the historical target potential fail location according to the target type.

For example, the first preset number may be one or two, which may be set according to actual needs. In the embodiments of the present disclosure, the first preset number may be one, which is just taken as an example for description, but it does not mean that the embodiments of the present disclosure is limited thereto.

Figure 3:
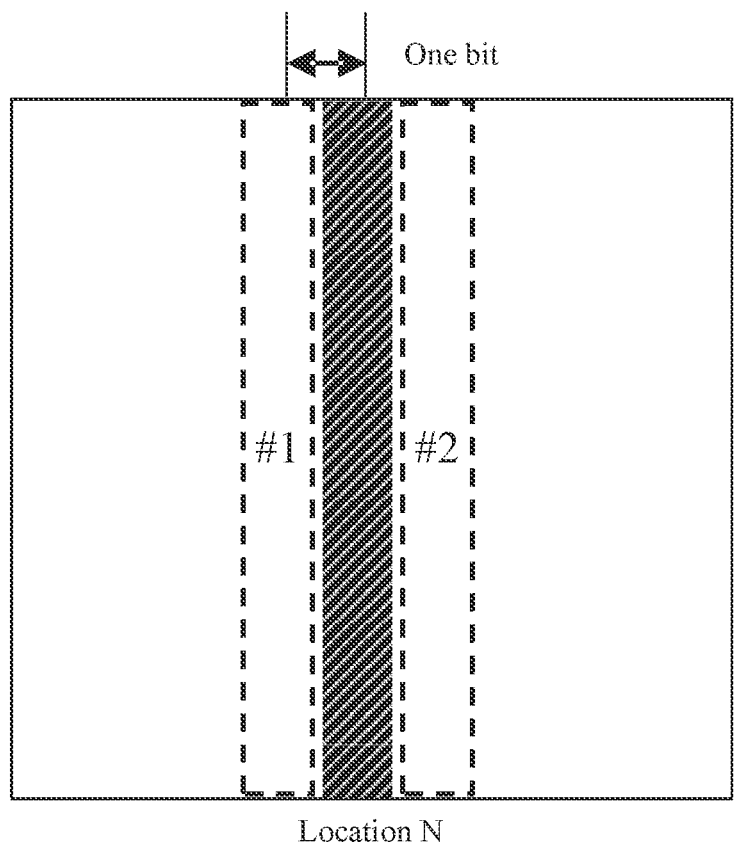
FIG. 3 is a schematic diagram showing a relationship between a historical potential fail location and a historical target potential fail location according to an embodiment of the present disclosure.

For example, when the bit location in close proximity to the historical potential fail location and at a distance of the first preset number of bits from the historical potential fail location is determined as the historical target potential fail location according to the target type, the bit location in a bit line direction at the distance of the first preset number of bits from the historical potential fail location is determined as the historical target potential fail location if the target type is the redundant word line type. An example is taken where the first preset number is one, referring to FIG. 3, FIG. 3 is a schematic diagram showing a relationship between a historical potential fail location and a historical target potential fail location according to an embodiment of the present disclosure. Locations having oblique lines in a location N as shown in FIG. 3 represent the historical potential fail locations, and the location numbered #1 and the location numbered #2 in the location N represent the historical target potential fail locations of the bit location at the distance of one bit from the historical potential fail location.

Figure 4:
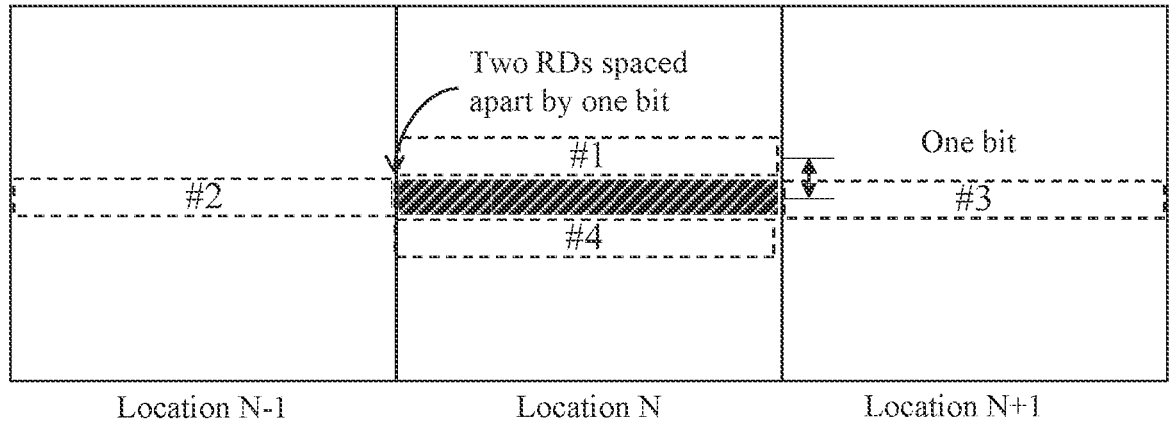
FIG. 4 is a schematic diagram showing a relationship between another historical potential fail location and another historical target potential fail location according to an embodiment of the present disclosure.

In another case, the bit location in a word line direction at the distance of the first preset number of bits from the historical potential fail location is determined as the historical target potential fail location if the target type is the redundant bit line type. Similarly, an example is taken where the first preset number is one, referring to FIG. 4, FIG. 4 is a schematic diagram showing a relationship between another historical potential fail location and another historical target potential fail location according to an embodiment of the present disclosure. Locations having oblique lines in a location N as shown in FIG. 4 represent the historical potential fail locations, and the location numbered #1 and the location numbered #4 in the location N and the location numbered #2 in the location N−1 and the location numbered #3 in the location N+1 represent the historical target potential fail locations of the bit location at the distance of one bit from the historical potential fail location.

Figure 5:
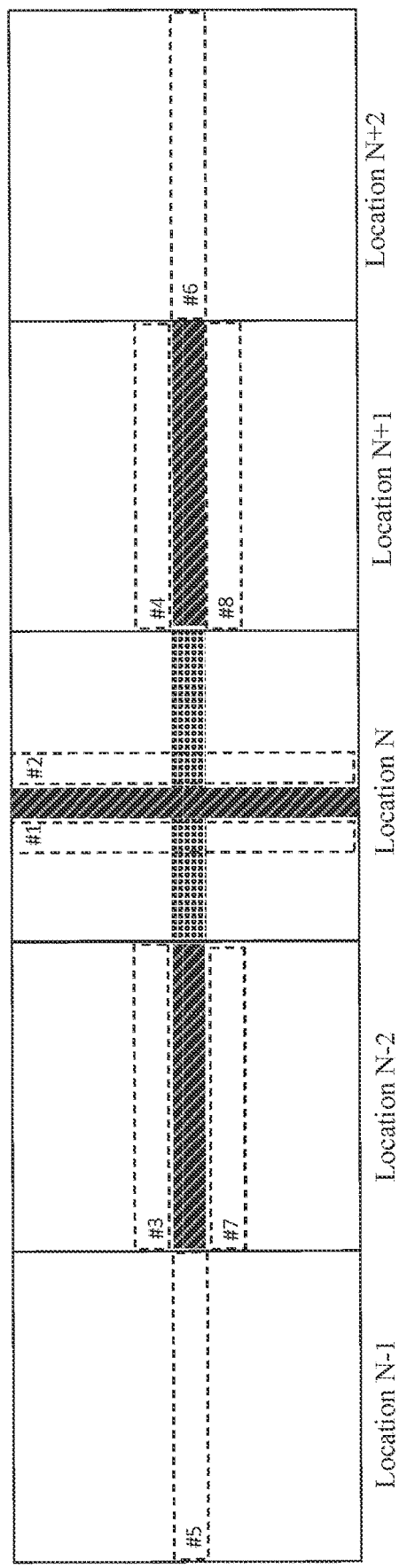
FIG. 5 is a schematic diagram showing a relationship between still another historical potential fail location and still another historical target potential fail location according to an embodiment of the present disclosure.

Similarly, an example is taken where the first preset number is one, referring to FIG. 5, FIG. 5 is a schematic diagram showing a relationship between still another historical potential fail location and still another historical target potential fail location according to an embodiment of the present disclosure. Locations having small square points in a location N as shown in FIG. 5 represent general repair locations containing fail bits. Locations having oblique lines in a location N−1, locations having oblique lines in a location N, and locations having oblique lines in a location N+1 represent the historical potential fail locations associated with the fail locations. The location numbered #5 in a location N−2, the location numbered #3 in the location N−1, and the location numbered #7 in the location N−1 represent the historical target potential fail locations of the historical potential bit locations having oblique lines in the location N−1. The location numbered #1 and the location numbered #2 in the location N represent the historical target potential fail locations of the historical potential bit locations having oblique lines in the location N. The location numbered #4 and the location numbered #8 in the location N+1, and the location numbered #6 in the location N+2 represent the historical target potential fail locations of the historical potential bit locations having oblique lines in the location N+1.

As shown in FIG. 3, FIG. 4 or FIG. 5, after the historical target potential fail location is determined based on the bit location in close proximity to the historical potential fail location, it is unable to directly determine the association relationship between the historical fail bit location and the historical target potential fail location as the potential mining rule because the historical target potential fail location is not necessarily a real fail location. Instead, it is needed to combine with the historically newly-added fail bit included in the historical sample data. That is, the potential mining rule is jointly determined according to the historically newly-added fail bit and the historical target potential fail location. That is, the following Step S203 is performed.

S203: determining the potential mining rule according to the historically newly-added fail bit and the historical target potential fail location.

For example, number of the historical target potential fail locations may be one or more, which may be set according to actual needs. However, the number of the historical target potential fail locations is not further limited in the embodiments of the present disclosure.

In the embodiments of the present disclosure, an example is taken where the number of the historical target potential fail locations is more, when the potential mining rule is determined according to the historically newly-added fail bit and the historical target potential fail location, at least two following possible implementations may be included. It is to be understood that in the embodiments of the present disclosure, the following two possible implementations are only taken as examples for description, but it does not mean that the embodiments of the present disclosure are limited thereto.

In a possible implementation, for a given one of the plurality of historical target potential fail locations, if it is determined that the given historical target potential fail location does not include a historically newly-added fail bit, this indicates that the given historical target potential fail location is not associated with a fail location. That is, when the fail location has a fault, the given historical target potential fail location does not malfunction. Therefore, there is no need to update number of times of a combination of relationships corresponding to the given historical target potential fail location. Instead, if it is determined that the given historical target potential fail location includes the historically newly-added fail bit, this indicates that the given historical target potential fail location is associated with a fail location. That is, when the fail location has a fault, the given historical target potential fail location may likely malfunction. Therefore, it is needed to update the number of times of the combination of relationships corresponding to the given historical target potential fail location. For example, the updated number of times of the combination of relationships corresponding to the given historical target potential fail location may be obtained by plus one to the number of times before updating. In this way, the updated number of times of the combination of relationships corresponding to the given historical target potential fail location may be obtained. The combination of relationships includes an identifier of the preset mining rule and an identifier of the historical target potential fail location.

Figure 6:
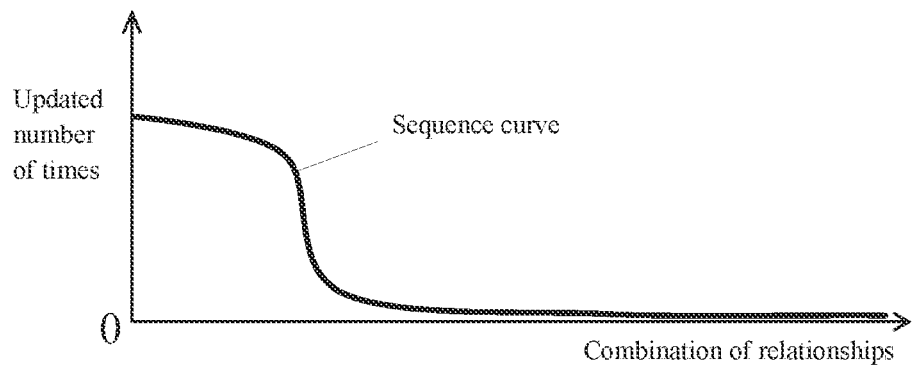
FIG. 6 is a schematic diagram of a sequence curve according to an embodiment of the present disclosure.

After the updated number of times of the combination of relationships corresponding to the given historical target potential fail location is obtained, a relationship sequence may be obtained by sorting the combination of relationships corresponding to the given historical target potential fail location in descending order of number of times according to the updated number of times of the combination of relationships corresponding to the given historical target potential fail location. Next, a sequence curve corresponding to the given historical target potential fail location may be obtained by fitting the relationship sequence corresponding to the given historical target potential fail location sorted. For example, referring to FIG. 6, FIG. 6 is a schematic diagram of a sequence curve according to an embodiment of the present disclosure, wherein an abscissa axis in FIG. 6 represents the combination of relationships, and an ordinate axis in FIG. 6 represents the updated number of times of the combination of relationships. After the sequence curve as shown in FIG. 6 is obtained, the potential mining rule may be further determined according to the sequence curve.

Figure 7:
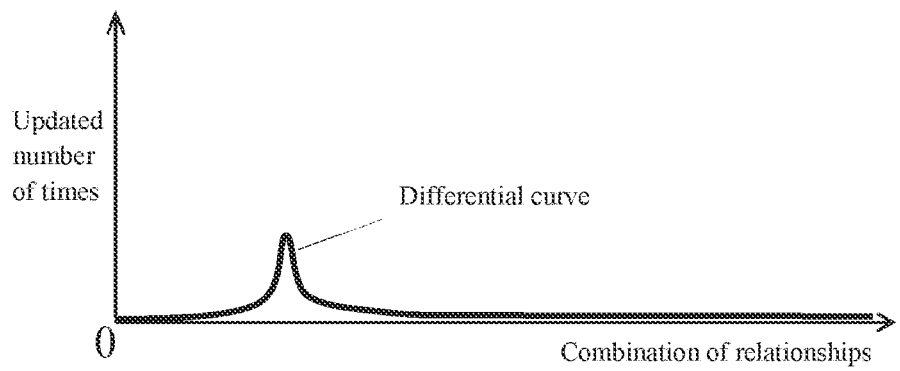
FIG. 7 is a schematic diagram of a differential curve according to an embodiment of the present disclosure.

For example, when determining the potential mining rule according to the sequence curve, differential processing may be performed on the sequence curve to obtain a differential curve corresponding to the given historical target potential fail location. For example, referring to FIG. 7, FIG. 7 is a schematic diagram of a differential curve according to an embodiment of the present disclosure, wherein an abscissa axis in FIG. 7 represents the combination of relationships, and an ordinate axis in FIG. 7 represents the updated number of times of the combination of relationships. After the differential curve as shown in FIG. 7 is obtained, the potential mining rule may be determined according to the differential curve.

Figure 8:
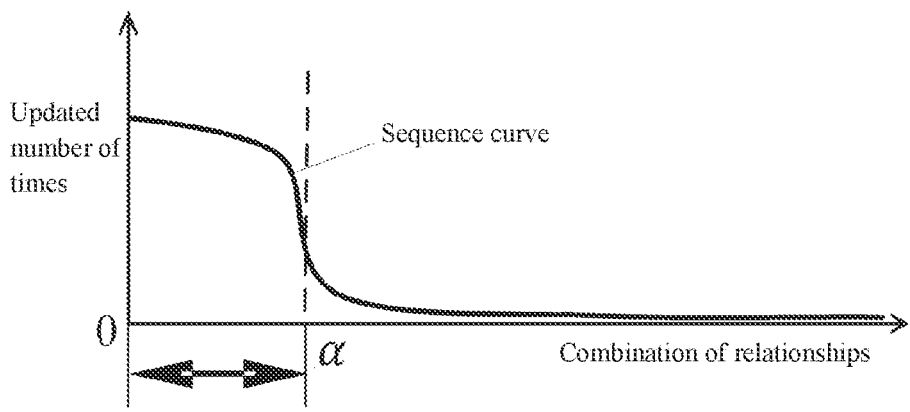
FIG. 8 is a schematic diagram of a location corresponding to a maximum differential value according to an embodiment of the present disclosure.

For example, when determining the potential mining rule according to the differential curve, a historical target potential fail location corresponding to a maximum differential value may be determined from the differential curve corresponding to the given historical target potential fail location α. For example, referring to FIG. 8, FIG. 8 is a schematic diagram of a location corresponding to a maximum differential value according to an embodiment of the present disclosure, wherein an abscissa axis in FIG. 8 still represents the combination of relationships, and an ordinate axis in FIG. 8 represents the updated number of times of the combination of relationships. After the historical target potential fail location a corresponding to the maximum differential value as shown in FIG. 8 is obtained, an association relationship between a historical fail location corresponding to the historical fail bit and a historical target potential fail location greater than the number of times of the combination of relationships of the historical target potential fail location corresponding to the maximum differential value may be directly determined as the potential mining rule, such that the potential mining rule is obtained. This is because if a fail location has a fault, the historical target potential fail location greater than the number of times of the combination of relationships of the historical target potential fail location corresponding to the maximum differential value may also probably have a fault.

In another possible implementation, when determining the potential mining rule according to the historically newly-added fail bit and the historical target potential fail location, for a given one of the plurality of historical target potential fail locations, number of historically newly-added fail bits included in the given historical target potential fail location may be respectively determined, and the potential mining rule may be determined according to the number of historically newly-added fail bits included in the given historical target potential fail location.

For example, when determining the potential mining rule according to the number of historically newly-added fail bits included in the given historical target potential fail location, the larger the number of historically newly-added fail bits included in the historical target potential fail location is, the more likely the historical target potential fail location may have a fault if a fail location has a fault, and the larger the number of fail bits that have fault in the given historical target potential fail location. Therefore, in a possible implementation, an association relationship between a top second preset number of historical target potential fail locations among the plurality of historical target potential fail locations and a historical fail location corresponding to the historical fail bit may be determined as the potential mining rule in a descending order of the number. In another possible implementation, an association relationship between a historical fail location corresponding to the historical fail bit and a given one of the plurality of historical target potential fail locations where the number of the historically newly-added fail bits is greater than a third preset number may be directly determined as the potential mining rule.

A value of the second preset number and a value of the third preset number may be set according to actual needs. Here, the value of the second preset number and the value of the third preset number are not further limited in the embodiments of the present disclosure.

As can be seen from the embodiments of the present disclosure, historical sample data may be relied on when determining the potential mining rule, a bit location in close proximity to the historical potential fail location included in the historical sample data is determined as the historical target potential fail location. Next, the potential mining rule is determined according to the historically newly-added fail bit and the historical target potential fail location included in the historical sample data. In this way, a target potential fail bit associated with a fail bit may be determined based on the potential mining rules, and more target potential fail bits associated with the fail bit may be mined out, such that when a fail location corresponding to the fail bit and a target potential fail location corresponding to the target potential fail bit are repaired subsequently, omission of repairing the fail bit location may be avoided to a certain extent. In this way, probability of failure of the wafer can be effectively reduced.

Based on any one of the foregoing embodiments, it is to be understood that in the embodiments of the present disclosure, mining rules included in the foregoing mining rule library cannot always accurately determine the target potential fail bit associated with the fail bit. For example, when the historically newly-added fail bit no longer meets some mining rules included in the mining rule library, inaccurate mining rules need to be eliminated. That is, the mining rule library is dynamically changing, not just only increasing. Hereinafter, how to dynamically update the mining rule library effectively in the embodiments of the present disclosure will be described in detail based on an embodiment as shown in FIG. 9.

Figure 9:
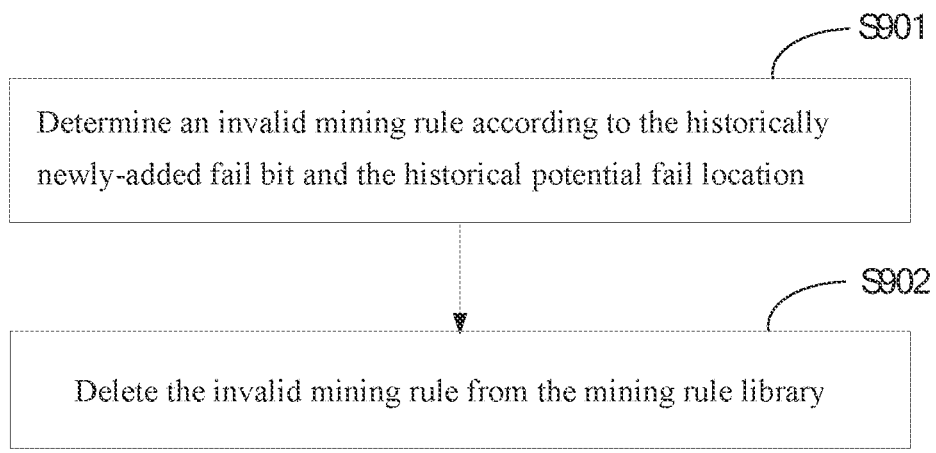
FIG. 9 is a schematic flowchart of a method for dynamically updating a mining rule library according to an embodiment of the present disclosure.

FIG. 9 is a schematic flowchart of a method for dynamically updating a mining rule library according to an embodiment of the present disclosure. The method for dynamically updating a mining rule library may be executed by a software and/or hardware apparatus, wherein the hardware apparatus also may be an apparatus for repairing a fail location. For example, as shown in FIG. 9, the method for dynamically updating a mining rule library may include:

S901: determining an invalid mining rule according to the historically newly-added fail bit and the historical potential fail location.

For example, when determining an invalid mining rule according to the historically newly-added fail bit and the historical potential fail location, for a given one of the plurality of historical target potential fail locations, likewise number of historically newly-added fail bits included in the given historical potential fail location may be respectively determined, and then the invalid mining rule is determined according to the number of historically newly-added fail bits included in the given historical potential fail location.

For example, when determining the invalid mining rule according to the number of historically newly-added fail bits included in the given historical potential fail location, the smaller the number of historically newly-added fail bits included in the historical target potential fail location is, the less the fail location is associated with the historical target potential fail location. Therefore, a preset mining rule corresponding to a historical potential fail location among the plurality of historical potential fail locations where the number of the historically newly-added fail bits is less than a fourth preset number may be directly determined as the invalid mining rule. A value of the fourth preset number may be set according to actual needs. Here, the value of the fourth preset number is not further limited in the embodiments of the present disclosure.

After the invalid mining rule is determined, the invalid mining rule may be deleted from the mining rule library, to implement the dynamic update of the mining rule library.

S902: deleting the invalid mining rule from the mining rule library.

As can be seen from the embodiments of the present disclosure, an invalid mining rule may be determined according to the historically newly-added fail bit and the historical potential fail location, and the invalid mining rule is deleted from the mining rule library, such that inaccurate invalid mining rules may be eliminated. In this way, the dynamic update of the mining rule library is implemented, and accuracy of the mining rule library is improved.

Figure 10:
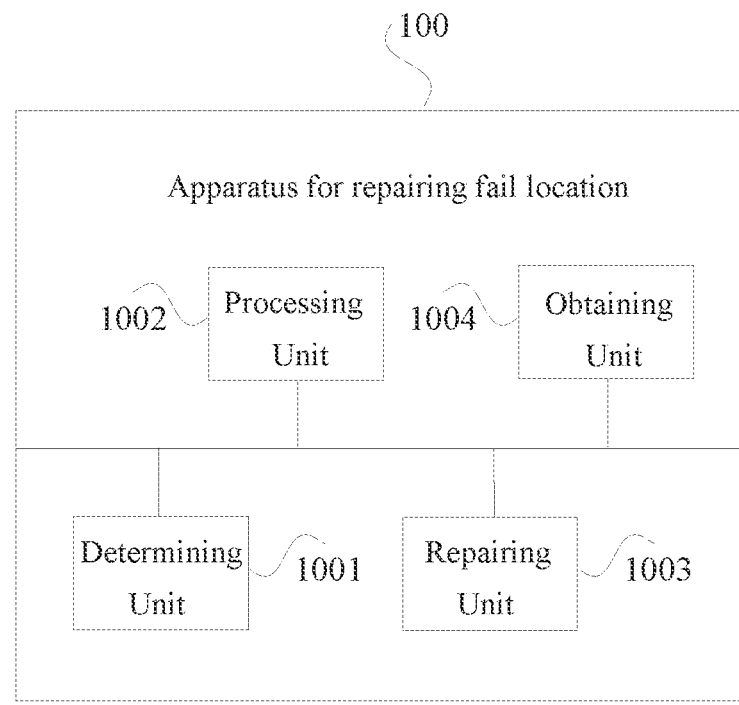
FIG. 10 is a schematic structural diagram of an apparatus for repairing a fail location according to an embodiment of the present disclosure.

FIG. 10 is a schematic structural diagram of an apparatus 100 for repairing a fail location according to an embodiment of the present disclosure. For example, as shown in FIG. 10, the apparatus 100 for repairing a fail location may include:

a determining unit 1001 configured to determine a fail bit in a wafer to be processed;

a processing unit 1002 configured to determine a target potential fail bit associated with the fail bit based on a mining rule in a mining rule library, wherein the mining rule library comprises a potential mining rule, and the potential mining rule is obtained by means of a potential fail location determined based on a preset mining rule; and a repairing unit 1003 configured to repair a fail location corresponding to the fail bit and a target potential fail location corresponding to the target potential fail bit, to obtain a repaired target wafer.

In some embodiments, the apparatus 100 for repairing a fail location further includes an obtaining unit 1004.

The obtaining unit 1004 is configured to obtain historical sample data, wherein the historical sample data comprise a historically newly-added fail bit associated with a historical fail bit and a historical potential fail location determined based on the preset mining rule.

The processing unit 1002 is also configured to determine a bit location in close proximity to the historical potential fail location as a historical target potential fail location, and determine the potential mining rule according to the historically newly-added fail bit and the historical target potential fail location.

In some embodiments, the processing unit 1002 is configured to determine a target type corresponding to the historical potential fail location, wherein the target type comprises a redundant word line type and a redundant bit line type. The processing unit 1002 is also configured to determine the bit location in close proximity to the historical potential fail location as the historical target potential fail location according to the target type.

In some embodiments, the processing unit 1002 is configured to determine, according to the target type, the bit location in close proximity to the historical potential fail location and at a distance of a first preset number of bits from the historical potential fail location as the historical target potential fail location.

In some embodiments, the processing unit 1002 is configured to: determine, if the target type is the redundant word line type, the bit location in a bit line direction at the distance of the first preset number of bits from the historical potential fail location as the historical target potential fail location; and determine, if the target type is the redundant bit line type, the bit location in a word line direction at the distance of the first preset number of bits from the historical potential fail location as the historical target potential fail location.

In some embodiments, a plurality of historical target potential fail locations are provided. The processing unit 1002 is configured to update, for a given one of the plurality of historical target potential fail locations, number of times of a combination of relationships corresponding to the given historical target potential fail location when determining that the given historical target potential fail location comprises the historically newly-added fail bit, wherein the combination of relationships comprises an identifier of the preset mining rule and an identifier of the historical target potential fail location. Furthermore, The processing unit 1002 is configured to: sort the combination of relationships corresponding to the given historical target potential fail location in descending order of number of times according to the updated number of times of the combination of relationships corresponding to the given historical target potential fail location, to obtain a relationship sequence; fit the relationship sequence corresponding to the given historical target potential fail location sorted to obtain a sequence curve corresponding to the given historical target potential fail location; and determine the potential mining rule according to the sequence curve.

In some embodiments, the processing unit 1002 is configured to perform differential processing on the sequence curve to obtain a differential curve corresponding to the given historical target potential fail location, and determine the potential mining rule according to the differential curve corresponding to the given historical target potential fail location.

In some embodiments, the processing unit 1002 is configured to determine a historical target potential fail location corresponding to a maximum differential value from the differential curve corresponding to the given historical target potential fail location, and determine the potential mining rule according to the historical target potential fail location corresponding to the maximum differential value.

In some embodiments, the processing unit 1002 is configured to determine, from the combination of relationships corresponding to the given historical target potential fail location, an association relationship between a historical fail location corresponding to the historical fail bit and a historical target potential fail location greater than the number of times of the combination of relationships of the historical target potential fail location corresponding to the maximum differential value as the potential mining rule.

In some embodiments, a plurality of historical target potential fail locations are provided. The processing unit 1002 is configured to: respectively determine, for a given one of the plurality of historical target potential fail locations, number of historically newly-added fail bits included in the given historical target potential fail location; and determine the potential mining rule according to the number of historically newly-added fail bits included in the given historical target potential fail location.

In some embodiments, the processing unit 1002 is configured to determine, in a descending order of the number, an association relationship between a top second preset number of historical target potential fail locations among the plurality of historical target potential fail locations and a historical fail location corresponding to the historical fail bit as the potential mining rule.

In some embodiments, the processing unit 1002 is configured to determine an association relationship between a historical fail location corresponding to the historical fail bit and a given one of the plurality of historical target potential fail locations where the number of the historically newly-added fail bits is greater than a third preset number as the potential mining rule.

In some embodiments, the processing unit 1002 is further configured to determine an invalid mining rule according to the historically newly-added fail bit and the historical potential fail location, and delete the invalid mining rule from the mining rule library.

In some embodiments, the processing unit 1002 is configured to respectively determine, for a given one of a plurality of historical potential fail locations, number of historically newly-added bits included in the given historical potential fail location, and determine the invalid mining rule according to the number of historically newly-added fail bits included in the given historical potential fail location.

In some embodiments, the processing unit 1002 is configured to determine a preset mining rule corresponding to a historical potential fail location among the plurality of historical potential fail locations where the number of the historically newly-added fail bits is less than a fourth preset number as the invalid mining rule.

The apparatus 100 for repairing a fail location provided by the embodiments of the present disclosure can perform the method for repairing a fail location provided by any one of the above embodiments. Reference may be made to implementation principles and beneficial effects of the method for repairing a fail location because they are similar to implementation principles and beneficial effects of the apparatus 100 for repairing a fail location, and thus detailed descriptions thereof are omitted here.

Figure 11:
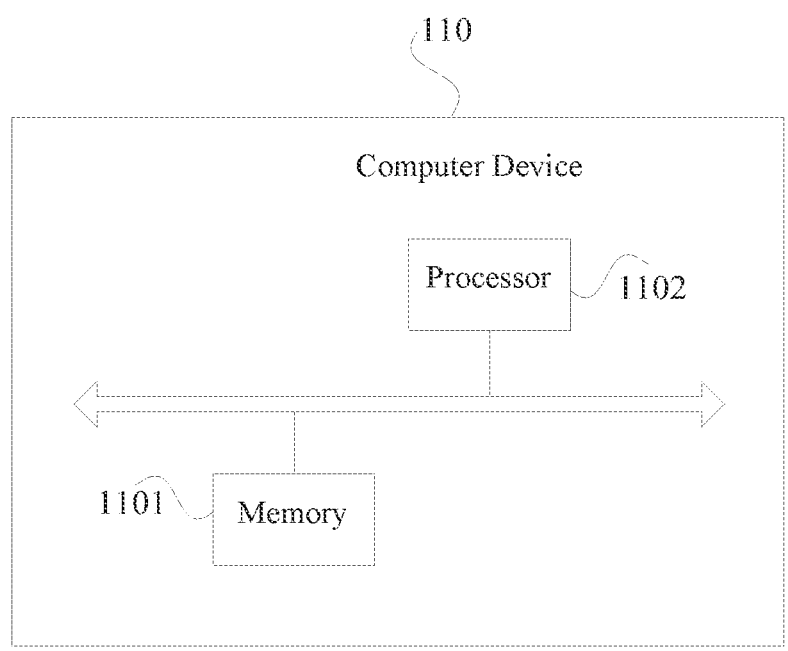
FIG. 11 is a schematic structural diagram of another computer device according to an embodiment of the present disclosure.

FIG. 11 is a schematic structural diagram of another computer device according to an embodiment of the present disclosure. For example, as shown in FIG. 11, the computer device includes:

a memory 1101, a processor 1102, and a computer program stored on the memory 1101 and running on the processor 1102, wherein the computer program is executable by the processor 1102, whereby the processor 1102 is configured to perform the method for repairing a fail location according to any one of the above embodiments. Reference may be made to the implementation principles and the beneficial effects of the method for repairing a fail location because they are similar to implementation principles and beneficial effects of the processor, and thus detailed descriptions thereof are omitted here.

The embodiments of the present disclosure also provide a readable storage medium having a computer program stored thereon, wherein the computer program is executable by a processor, whereby the processor is configured to perform the method for repairing a fail location according to any one of the above embodiments. Reference may be made to the implementation principles and the beneficial effects of the method for repairing a fail location because they are similar to implementation principles and beneficial effects of the processor, and thus detailed descriptions thereof are omitted here.

The embodiments of the present disclosure also provide a computer program product, which includes: a computer program. The computer program is stored in a readable storage medium, and at least one processor of an electronic device can read the computer program from the readable storage medium. The at least one processor executes the computer program, such that the electronic device is caused to perform the method for repairing a fail location according to any one of the above embodiments. Reference may be made to the implementation principles and the beneficial effects of the method for repairing a fail location because they are similar to implementation principles and beneficial effects of the at least one processor, and thus detailed descriptions thereof are omitted here.

From several embodiments provided in the present disclosure, it should be understood that the disclosed apparatus and method may be implemented by means of other manners. For example, the apparatus embodiments described above are merely exemplary. For example, a unit partition is merely a logic functional partition. In actual implementation, additional manners of partitioning may be available. For example, a plurality of units or components may be combined or integrated into another system, or some features may be ignored and not executed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, i.e., either located at one place or distributed on a plurality of network units. Units may be selected in part or in whole according to actual needs for achieving objectives of the solution of this embodiment. In addition, various functional units in various embodiments of the present disclosure may be integrated into one processing unit, or various units may be separately or physically existent, or two or more units may be integrated into one unit. The foregoing integrated units may either be implemented in the form of hardware or be implemented in the form of hardware and software function units.

The foregoing integrated modules may be stored in a computer-readable storage medium if they are implemented in the form of software function modules. The foregoing software function modules are stored in a storage medium, comprising some instructions to cause a computer device (a personal computer, a server, a network device or the like) or a processor to execute a part of steps of the method as recited in the embodiments of the present disclosure.

It is to be understood that the foregoing processor may be a central processing unit (CPU), or other general-purpose processor, digital signal processor (DSP), and application specific integrated circuit (ASIC), etc. The general-purpose processor may be a microprocessor, or the processor may be any conventional processor or the like. The steps of the methods disclosed in the present disclosure may be directly executed by a hardware processor, or may be executed by a combination of hardware and software modules in a processor.

The memory may include a high-speed random access memory (RAM), and may also include a non-volatile memory NVM), such as at least one magnetic-disk memory, and may also be a U disk, a mobile hard disk, a read-only memory, a magnetic disk, or an optical disk, etc.

A bus may be an Industry Standard Architecture (ISA) bus, a Peripheral Component Interconnect (PCI) bus, or an Extended Industry Standard Architecture (EISA) bus, etc. The bus may be classified into an address bus, a data bus, and a control bus, etc. For ease of representation, the bus in the accompanying drawings of the present disclosure is not limited to only one bus or one type of bus.

The computer-readable storage medium may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk, or an optical disk. The storage medium may be any usable medium accessible by a general or dedicated computer.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for repairing a fail location, comprising:
determining a fail bit in a wafer to be processed;
determining a target potential fail bit associated with the fail bit based on a mining rule in a mining rule library, wherein the mining rule library comprises a potential mining rule, the potential mining rule being obtained by means of a potential fail location determined based on a preset mining rule; and
repairing a fail location corresponding to the fail bit and a target potential fail location corresponding to the target potential fail bit, to obtain a repaired target wafer.

2. The method according to claim 1, wherein before determining a target potential fail bit associated with the fail bit based on a mining rule in a mining rule library, the method further comprises:
obtaining historical sample data, wherein the historical sample data comprise a historically newly-added fail bit associated with a historical fail bit and a historical potential fail location determined based on the preset mining rule;
determining a bit location in close proximity to the historical potential fail location as a historical target potential fail location; and
determining the potential mining rule according to the historically newly-added fail bit and the historical target potential fail location.

3. The method according to claim 2, wherein
the determining a bit location in close proximity to the historical potential fail location as a historical target potential fail location comprises:
determining a target type corresponding to the historical potential fail location, wherein the target type comprises a redundant word line type and a redundant bit line type; and
determining the bit location in close proximity to the historical potential fail location as the historical target potential fail location according to the target type.

4. The method according to claim 3, wherein
the determining the bit location in close proximity to the historical potential fail location as the historical target potential fail location according to the target type comprises:
determining, according to the target type, the bit location in close proximity to the historical potential fail location and at a distance of a first preset number of bits from the historical potential fail location as the historical target potential fail location.

5. The method according to claim 4, wherein
the determining, according to the target type, the bit location in close proximity to the historical potential fail location and at a distance of a first preset number of bits from the historical potential fail location as the historical target potential fail location comprises:
determining, if the target type is the redundant word line type, the bit location in a bit line direction at the distance of the first preset number of bits from the historical potential fail location as the historical target potential fail location; and
determining, if the target type is the redundant bit line type, the bit location in a word line direction at the distance of the first preset number of bits from the historical potential fail location as the historical target potential fail location.

6. The method according to claim 2, wherein
a plurality of the historical target potential fail locations are provided;
and the determining the potential mining rule according to the historically newly-added fail bit and the historical target potential fail location comprises:
for a given one of the plurality of historical target potential fail locations, updating number of times of a combination of relationships corresponding to the given historical target potential fail location when determining that the given historical target potential fail location comprises the historically newly-added fail bit, wherein the combination of relationships comprises an identifier of the preset mining rule and an identifier of the historical target potential fail location;
sorting the combination of relationships corresponding to the given historical target potential fail location in descending order of number of times according to the updated number of times of the combination of relationships corresponding to the given historical target potential fail location, to obtain a relationship sequence;
fitting the relationship sequence corresponding to the given historical target potential fail location sorted to obtain a sequence curve corresponding to the given historical target potential fail location; and determining the potential mining rule according to the sequence curve.

7. The method according to claim 6, wherein
the determining the potential mining rule according to the sequence curve comprises:
performing differential processing on the sequence curve to obtain a differential curve corresponding to the given historical target potential fail location; and
determining the potential mining rule according to the differential curve corresponding to the given historical target potential fail location.

8. The method according to claim 7, wherein
the determining the potential mining rule according to the differential curve corresponding to the given historical target potential fail location comprises:
determining a historical target potential fail location corresponding to a maximum differential value from the differential curve corresponding to the given historical target potential fail location; and
determining the potential mining rule according to the historical target potential fail location corresponding to the maximum differential value.

9. The method according to claim 8, wherein
the determining the potential mining rule according to the historical target potential fail location corresponding to the maximum differential value comprises:
determining, from the combination of relationships corresponding to the given historical target potential fail location, an association relationship between a historical fail location corresponding to the historical fail bit and a historical target potential fail location greater than the number of times of the combination of relationships of the historical target potential fail location corresponding to the maximum differential value as the potential mining rule.

10. The method according to claim 2, wherein
a plurality of the historical target potential fail locations are provided;
and the determining the potential mining rule according to the historically newly-added fail bit and the historical target potential fail location comprises:
respectively determining, for a given one of the plurality of historical target potential fail locations, number of historically newly-added fail bits included in the given historical target potential fail location; and
determining the potential mining rule according to the number of historically newly-added fail bits included in the given historical target potential fail location.

11. The method according to claim 10, wherein
the determining the potential mining rule according to the number of historically newly-added fail bits included in the given historical target potential fail location comprises:
determining, in a descending order of the number, an association relationship between a top second preset number of historical target potential fail locations among the plurality of historical target potential fail locations and a historical fail location corresponding to the historical fail bit as the potential mining rule.

12. The method according to claim 10, wherein
the determining the potential mining rule according to the number of historically newly-added fail bits included in the given historical target potential fail location comprises:

determining an association relationship between a historical fail location corresponding to the historical fail bit and a given one of the plurality of historical target potential fail locations where the number of the historically newly-added fail bits is greater than a third preset number as the potential mining rule.

13. The method according to claim 2, further comprising:
determining an invalid mining rule according to the historically newly-added fail bit and the historical potential fail location; and
deleting the invalid mining rule from the mining rule library.

14. The method according to claim 13, wherein
the determining an invalid mining rule according to the historically newly-added fail bit and the historical potential fail location comprises:
respectively determining, for a given one of a plurality of historical potential fail locations, number of historically newly-added bits included in the given historical potential fail location; and
determining the invalid mining rule according to the number of historically newly-added fail bits included in the given historical potential fail location.

15. The method according to claim 14, wherein
the determining the potential mining rule according to the number of historically newly-added fail bits included in the given historical potential fail location comprises:
determining a preset mining rule corresponding to a historical potential fail location among the plurality of historical potential fail locations where the number of the historically newly-added fail bits is less than a fourth preset number as the invalid mining rule.

16. An apparatus for repairing a fail location, comprising:
a determining unit configured to determine a fail bit in a wafer to be processed;
a processing unit configured to determine a target potential fail bit associated with the fail bit based on a mining rule in a mining rule library, wherein the mining rule library comprises a potential mining rule, the potential mining rule being obtained by means of a potential fail location determined based on a preset mining rule; and
a repairing unit configured to repair a fail location corresponding to the fail bit and a target potential fail location corresponding to the target potential fail bit, to obtain a repaired target wafer.

17. A non-transitory storage medium having
a computer program stored thereon, wherein the computer program is executable by a processor, whereby the processor is configured to perform a method for repairing a fail location, the method comprising:
determining a fail bit in a wafer to be processed;
determining a target potential fail bit associated with the fail bit based on a mining rule in a mining rule library, wherein the mining rule library comprises a potential mining rule, the potential mining rule being obtained by means of a potential fail location determined based on a preset mining rule; and
repairing a fail location corresponding to the fail bit and a target potential fail location corresponding to the target potential fail bit, to obtain a repaired target wafer.

18. A computer device, comprising
a memory, a processor, and a computer program stored on the memory and running on the processor, wherein the computer program is executable by the processor, whereby the processor is configured to perform a method for repairing a fail location, the method comprising:

determining a fail bit in a wafer to be processed;
determining a target potential fail bit associated with the fail bit based on a mining rule in a mining rule library, wherein the mining rule library comprises a potential mining rule, the potential mining rule being obtained by means of a potential fail location determined based on a preset mining rule; and
repairing a fail location corresponding to the fail bit and a target potential fail location corresponding to the target potential fail bit, to obtain a repaired target wafer.

* * * * *